US012607787B2

(12) United States Patent
Hansson

(10) Patent No.: US 12,607,787 B2
(45) Date of Patent: Apr. 21, 2026

(54) DIFFRACTIVE OPTICAL ELEMENTS AND MASTER TOOLS FOR PRODUCING THE DIFFRACTIVE OPTICAL ELEMENTS

(71) Applicant: NIL Technology ApS, Kongens Lyngby (DK)

(72) Inventor: Niklas Hansson, Askim (SE)

(73) Assignee: NIL Technology ApS, Kongens Lyngby (DK)

( * ) Notice: Subject to any disclaimer, the term of this patent is extended or adjusted under 35 U.S.C. 154(b) by 563 days.

(21) Appl. No.: 18/024,110

(22) PCT Filed: Aug. 31, 2021

(86) PCT No.: PCT/EP2021/074058
§ 371 (c)(1),
(2) Date: Mar. 1, 2023

(87) PCT Pub. No.: WO2022/049090
PCT Pub. Date: Mar. 10, 2022

(65) Prior Publication Data
US 2023/0280510 A1      Sep. 7, 2023

Related U.S. Application Data

(60) Provisional application No. 63/074,026, filed on Sep. 3, 2020.

(51) Int. Cl.
*G02B 5/18* (2006.01)
*B29C 33/42* (2006.01)
*B81C 99/00* (2010.01)
(52) U.S. Cl.
CPC ........... *G02B 5/1847* (2013.01); *B29C 33/42* (2013.01); *B81C 99/006* (2013.01); *G02B 5/1857* (2013.01)

(58) Field of Classification Search
CPC ..... B81C 99/006; B29C 33/42; G02B 5/1847; G02B 5/1857
See application file for complete search history.

(56) References Cited

U.S. PATENT DOCUMENTS

| | | | |
|---|---|---|---|
| 7,508,585 | B2 | 3/2009 | Maeno |
| 7,658,877 | B2 | 2/2010 | Rudmann et al. |

(Continued)

FOREIGN PATENT DOCUMENTS

| | | | |
|---|---|---|---|
| CN | 101069189 A | 11/2007 | |
| CN | 101236266 A | 8/2008 | |

(Continued)

OTHER PUBLICATIONS

Office Action in Chinese Appln. No. 202180054524.7, mailed on Dec. 1, 2025, 12 pages (with English translation).

(Continued)

*Primary Examiner* — Jia X Pan
(74) *Attorney, Agent, or Firm* — Fish & Richardson P.C.

(57) ABSTRACT

The present disclosure describes diffractive optical elements (DOEs) and master tools for producing the DOEs. In one aspect, the disclosure describes a method that includes modifying a first pixel layout design for diffractive optical elements to obtain a modified pixel layout design. The first pixel layout design comprises pixels, each of which has a shape of a regular polygon (e.g., a rectangular shape). Modifying the first pixel layout design includes approximating a shape contour of a cluster of pixels in the first pixel layout design by a single polygon that reduces a total number of edges relative to the shape contour of the cluster of pixels in the first pixel layout design. The method also includes using the modified pixel layout design to form a master tool for production of the diffractive optical elements.

8 Claims, 8 Drawing Sheets

(56) References Cited

U.S. PATENT DOCUMENTS

| | | | |
|---|---|---|---|
| 8,221,665 | B2 | 7/2012 | Rudmann et al. |
| 8,233,370 | B2 | 7/2012 | Yasui |
| 2010/0020400 | A1* | 1/2010 | Amako .............. B23K 26/0673 |
| | | | 430/321 |
| 2012/0262787 | A1 | 10/2012 | Zeitner et al. |
| 2016/0178358 | A1* | 6/2016 | Miyasaka .............. G01B 11/25 |
| | | | 359/558 |
| 2017/0102679 | A1* | 4/2017 | Greene ................... G06T 19/00 |
| 2019/0041656 | A1 | 2/2019 | Ahmed et al. |
| 2019/0285899 | A1 | 9/2019 | Levola et al. |
| 2020/0116908 | A1* | 4/2020 | Toyama .............. G02B 5/1871 |
| 2023/0213779 | A1* | 7/2023 | Johansen ............. G02B 5/0268 |
| | | | 359/558 |

FOREIGN PATENT DOCUMENTS

| | | |
|---|---|---|
| CN | 109212636 | 1/2019 |
| CN | 109782528 A | 5/2019 |
| CN | 114008619 A | 2/2022 |
| EP | 0674190 | 9/1995 |
| TW | I625559 | 6/2018 |
| TW | 201839430 | 11/2018 |
| TW | 201945842 | 12/2019 |
| WO | WO 2003023488 | 3/2003 |

OTHER PUBLICATIONS

International Preliminary Report on Patentability in International Appln. No. PCT/EP2021/074058, dated Mar. 16, 2023, 10 pages.

International Search Report and Written Opinion in International Appln. No. PCT/EP2021/074058, dated Jan. 7, 2022, 14 pages.

Jia et al., "Use of two-photon polymerization for continuous gray-level encoding of diffractive optical elements," Applied Physics Letters, 2007, 90(7):073503.

Miao et al., "Design of diffractive optical element projector for a pseudorandom dot array by an improved encoding method," Applied Optics, 2019, 58(34):G169-G176.

Office Action in Taiwanese Appln. No. 110132635, dated Jun. 20, 2022, 8 pages (with English Translation).

Pelli et al., "Replicated data-matrix array generators," Optics Communications, 2006, 260:329-336.

Pitchumani, "Additive Lithography Fabrication and Integration of Micro Optics," A dissertation submitted in partial fulfillment of the requirements for the degree of Doctor of Philosophy in the College of Optics and Photonics at the University of Central Florida, Spring Term, 2006, 188 pages.

Ruffato et al., "Design, fabrication and characterization of computer generated holograms for anti-counterfeiting applications using OAM beams as light decoders," Scientific Reports, 2017, 7:18011.

Schellenberg, "Resolution enhancement technology: the past, the present, and extensions for the future," Proceedings of SPIE, Optical Microlithography XVII, 2004, 5377, 21 pages.

* cited by examiner

Exposure with Mask 1
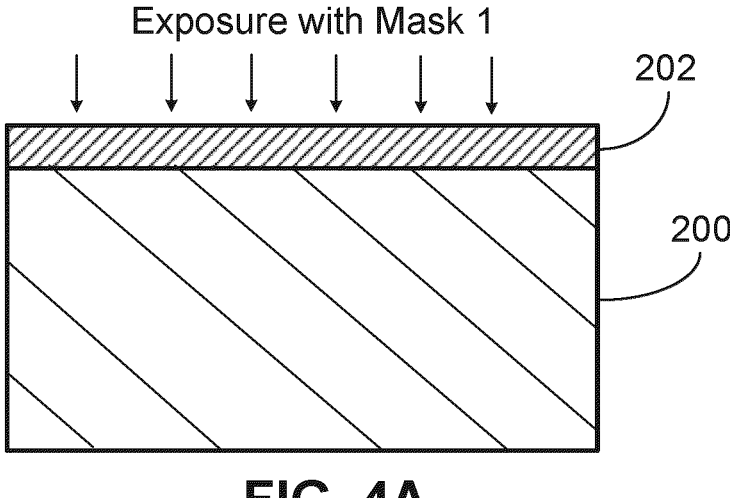
202
200
FIG. 4A
Etching into the substrate
202
216
200
FIG. 4B
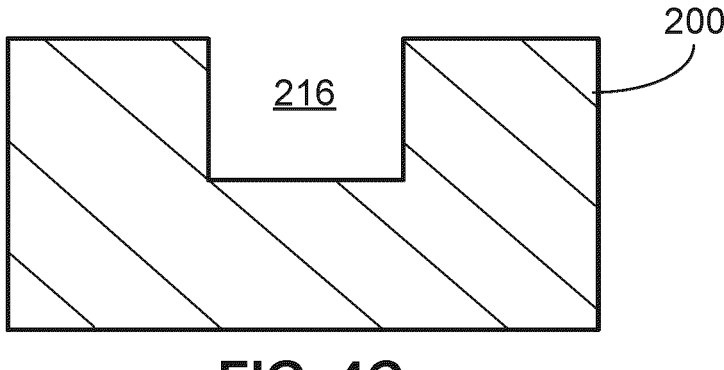
200
216
FIG. 4C

Exposure with Mask 2
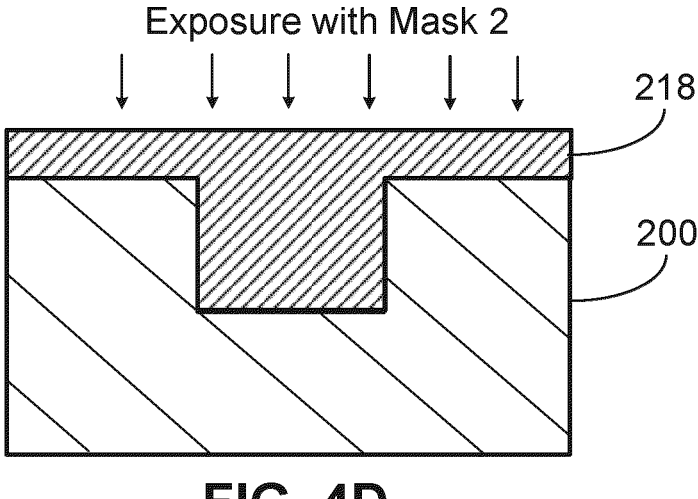
FIG. 4D
Etching into the
substrate
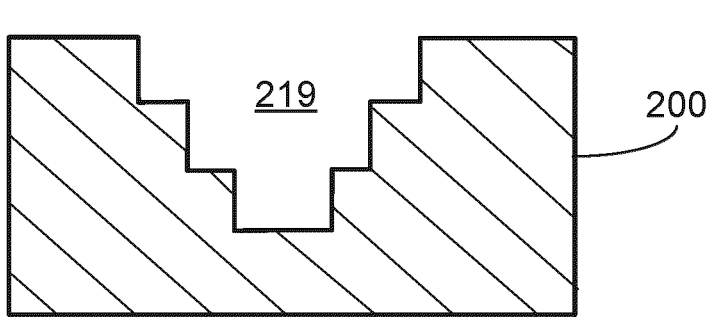
FIG. 4E
FIG. 4F Exposure with Mask 3

Etching into the substrate

Pixelated result from FFT

Line edge roughness
resulting from manufacturing
based on pixellated design

Result of manufacturing
based on modified pixel
design layout

DIFFRACTIVE OPTICAL ELEMENTS AND MASTER TOOLS FOR PRODUCING THE DIFFRACTIVE OPTICAL ELEMENTS

CROSS-REFERENCE TO RELATED APPLICATIONS

This application is a National Stage Application under 35 U.S.C. § 371 and claims the benefit of International Application No. PCT/EP2021/074058, filed Aug. 31, 2021, which claims priority to U.S. Application No. 63/074,026, filed Sep. 3, 2020, the disclosures of which are incorporated herein by reference.

FIELD OF THE DISCLOSURE

The present disclosure relates to diffractive optical elements (DOEs) and master tools for producing the DOEs.

BACKGROUND

DOEs are optical components that are operable to modify an incident light's phase and/or amplitude to create a desired optical output pattern with a specified functionality. DOEs may have a structure composed, for example, of two or more levels, formed on the surface of a substrate. The pattern may be etched, for example, into the surface of a hard substrate or replicated in a polymer on the surface of a substrate or made purely in polymer. In some instances, the depth of the pattern may be on the order of the wavelength of the light, specific to the application, and adjusted to the refractive index of the material of the DOE.

DOEs can be mass-produced by various technologies, including replication processes. As an example, in an ultraviolet (UV) replication process, the surface topology of a master structure is duplicated into a thin film of a UV-curable replication material such as an UV-curable epoxy resin on top of a substrate. In some instances, a tool (i.e., a negative copy) may be prepared from a master, and the tool then is used to UV-replicate the epoxy resin.

In the complete production chain of a wafer-scale replication, a "generation process" sometimes is used. A generation may include fabrication of a master tool, the subsequent fabrication of at least one replication tool from the master, and the subsequent fabrication of the DOEs. For industrial production, typically second or third generation replicas may be produced. One reason to introduce a generation process is to protect the relatively expensive original master.

SUMMARY

The present disclosure describes diffractive optical elements (DOEs) and master tools for producing the DOEs.

For example, in one aspect, the disclosure describes a method that includes modifying a first pixel layout design for diffractive optical elements to obtain a modified pixel layout design. The first pixel layout design comprises pixels, each of which has a shape of a regular polygon (e.g., a rectangular shape). Modifying the first pixel layout design includes approximating a contour of a cluster of pixels in the first pixel layout design by a single polygon that reduces a total number of edges relative to the contour of the cluster of pixels in the first pixel layout design. The method also includes using the modified pixel layout design to form a master tool for production of the diffractive optical elements.

Some implementations include one or more of the following features. For example, in some instances, the method included performing the modifying with respect to one or more clusters of pixels in each of different levels of the first pixel layout design. Modifying the first pixel layout design can include approximating the contour of the cluster of pixels in the first pixel layout design by a single polygon that shortens an overall length of the edges relative to the contour of the cluster of pixels in the first pixel layout design. In some instances, approximating the contour of the cluster of pixels includes replacing a zig-zag portion of a contour of the cluster of pixels with a straight line. In some cases, the method includes determining the straight line by minimizing a difference between (i) a first area of the pixels in the cluster, wherein the first area is beyond a boundary of the approximated contour defined in part by the straight line and (ii) a second area that is not part of the pixels in the cluster and that is within the boundary. In some instances, approximating the contour of the cluster of pixels includes replacing each corner node in the cluster with a respective pair of nodes. Approximating the contour of the cluster of pixels can include, for example, replacing each corner node in the cluster with a respective pair of nodes, each of which is displaced relative to the corner node. In some implementations, the method includes merging a plurality of clusters of pixels, whose contour coincides in at least one point, in the first pixel layout design to obtain a merged cluster of pixels, and approximating a contour of the merged cluster of pixels by replacing each corner node in the contour of the merged cluster with a respective pair of nodes.

The present disclosure also describes a diffractive optical element including a multi-level structured surface, at least a portion of which has a contour having straight lines, each of which has a length larger than a pixel size in the optical element, wherein the pixel size is a center-to-center distance between two adjacent pixels having a common center, and wherein the contour that changes direction at least once at an angle $\theta$, where $2°<\theta<88°$ or $92°<\theta<178°$.

The present disclosure further describes a master tool for manufacturing diffractive optical elements. The master tool includes a substrate having a multi-level structured surface corresponding to a pixel layout design for the diffractive optical elements, wherein at least part of the structured surface has a contour that changes direction at an angle $\theta$, where $2°<\theta<88°$ or $92°<\theta<178°$.

Some implementations include one or more of the following advantages. For example, in some implementations, DOEs manufactured based on a master tool obtained using a modified pixel layout design as described in this disclosure can have less line edge roughness, and thus better optical performance. In some instance, the occurrence of pointy tips at the pixel corners can be reduced or eliminated. Further, in some cases, the amount of memory needed to store the information for the pixel layout design can be reduced, which may make production easier. In some instances, more complicated optical designs can be achieved because less computational power is required.

Other aspects, features and advantages will be readily apparent form the following detailed description, the accompanying drawings, and the claims.

BRIEF DESCRIPTION OF THE DRAWINGS

FIGS. 4A-4I illustrate an example of a process of fabricating a master tool based on a modified pixel layout design.

DETAILED DESCRIPTION

One of the initial tasks in fabricating DOEs is to determine a pixel layout design based on the desired optical performance and design criteria of the optical elements. In this context, a pixel refers to the smallest building block used when making the optical design. Typically, each pixel in the design has a regular polygonal shape (e.g., rectangular or square) whose sides may have dimensions on the order of several hundred nanometers (nm) or less. The layout design can include the pixel layout corresponding to an individual DOE, as well as the overall layout for wafer-level production. The depth of the pixels in the DOE structure may differ from one another. Thus, the pixel layout design may include two or more levels, each of which corresponds to a different depth. In some instances there may be as many four or sixteen different levels, although the particular number of levels will depend on the optical performance and functionality needed for the particular application. The pixel layout design includes a respective pattern or other layout of pixels for each level, and can include, for example, microstructures and/or nanostructures. A master tool then is prepared based on the pixel layout design. Thus, the master tool can include a multi-level structured surface that corresponds to the pixel layout design. The structured surface can be transferred (e.g., by replication) to other materials.

The inventor(s) of the present disclosure recognized that various advantages may be obtained in some cases by approximating the contour of a cluster of pixels in a particular level of the original layout design in which each of the individual pixels has the contour of a regular polygon (e.g., a rectangle or square). The overall contour of a particular cluster of original regular polygonal pixels can be approximated, for example, by a single polygon that reduces the total number of edges and shortens the total length of the edges relative to the contour of the cluster of pixels in the original layout design. The contour of the replacement polygon may have fewer corners and/or less zig-zag than the corresponding cluster of pixels in the original design. This technique may be applied to some or all clusters of pixels at each level of the pixel layout design. The approximated contours of the clusters of pixels (i.e., the replacement polygons) then can be used in a replacement layout design to form the master tool for the DOEs as described in greater detail below.

Figures 1A, 1B, 1C:
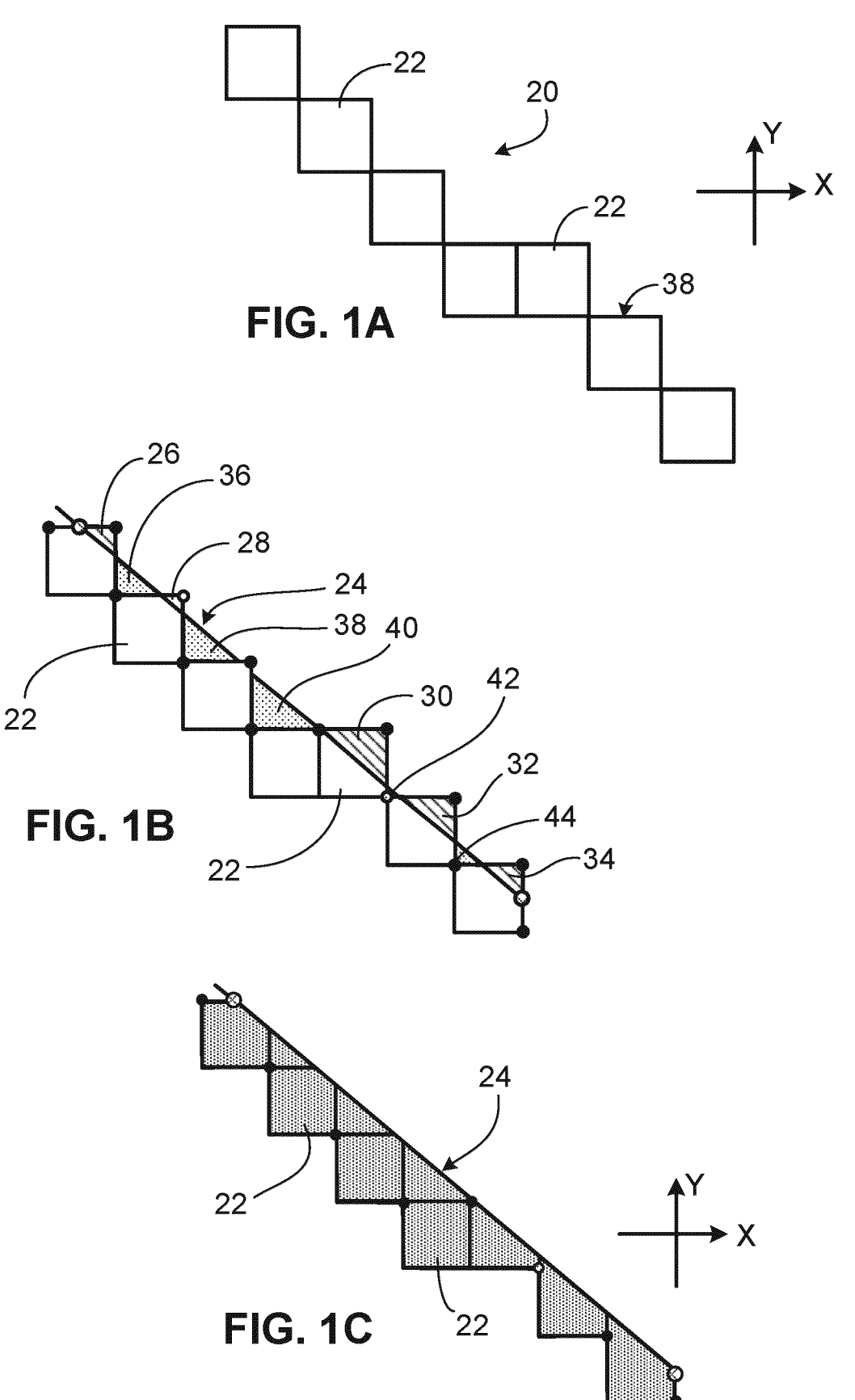
FIGS. 1A-1C illustrate an example of replacing a portion of an original pixel layout design with a modified pixel layout design.

FIGS. 1A and 1B illustrate an example in which part of the zig-zag contour (i.e., the edges) of a cluster 20 of pixels 22 in an original pixel layout design (FIG. 1A) is approximated by a straight line 24 (FIG. 1B). In some instances, determination of the straight line 24 can be achieved by minimizing the difference between (i) the area of the original pixels that would be outside the contour defined in part by the straight line 24 (i.e., areas 26, 28, 30, 32, 34 in FIG. 1B) and (ii) the area that would be within the contour defined in part by the straight line 24 and that was not part of the area of the original pixels (i.e., areas 36, 38, 40, 42, 44 in FIG.

1B). The foregoing technique also can be applied to one or more other portions of the contour of the cluster 20 of original pixels. The contour of the cluster 20 of original pixels (FIG. 1A) then would be replaced with a contour having an edge defined by the straight line 24, as shown in FIG. 1C. Other portions of the zig-zag contour of the cluster 20 of pixels 22 in the original pixel layout design can be approximated by straight lines in a similar manner.

In minimizing the difference between (i) and (ii) as set forth above, further constraints also may be used in some instances. For example, the difference between (i) and (ii) can be minimized while the number of nodes (i.e., corners of the original pixels 22) required to define the line 24 is reduced by at least a specified amount (e.g., 40% or 60%) relative to the number of nodes that define the edge in the original pixel design. Thus, in the example of FIGS. 1A-1C, there are fourteen nodes (corners) that define the edge 38 in the original cluster 20 of pixels 22, whereas only two nodes are needed to define the straight line 24.

Using the foregoing technique to approximate the contour of a cluster of pixels in a particular level of the original layout design can result, in some instances, in the contour of the replacement polygon having less zig-zag than the contour of the original cluster of pixels. For example, assuming the contour of the original cluster of pixels is only along the x or y axes, portions of the contour of the replacement polygon may be inclined or slanted in the x-y plane (see FIG. 1C). Thus, the contour of the cluster of pixels in the modified layout design may change direction at an angle θ of ninety degrees, as well as at angles of more or less than ninety degrees (e.g., 0°<θ<90° or 90°<θ<180°). In some cases, the contour may change direction by an angle θ, where 2°<θ<88° or 92°<θ<178°. Further, in some cases, the contour may change direction by an angle θ, where 5°<θ<85° or 95°θ<θ<175°.

Figures 2A, 2B, 2C, 2D:
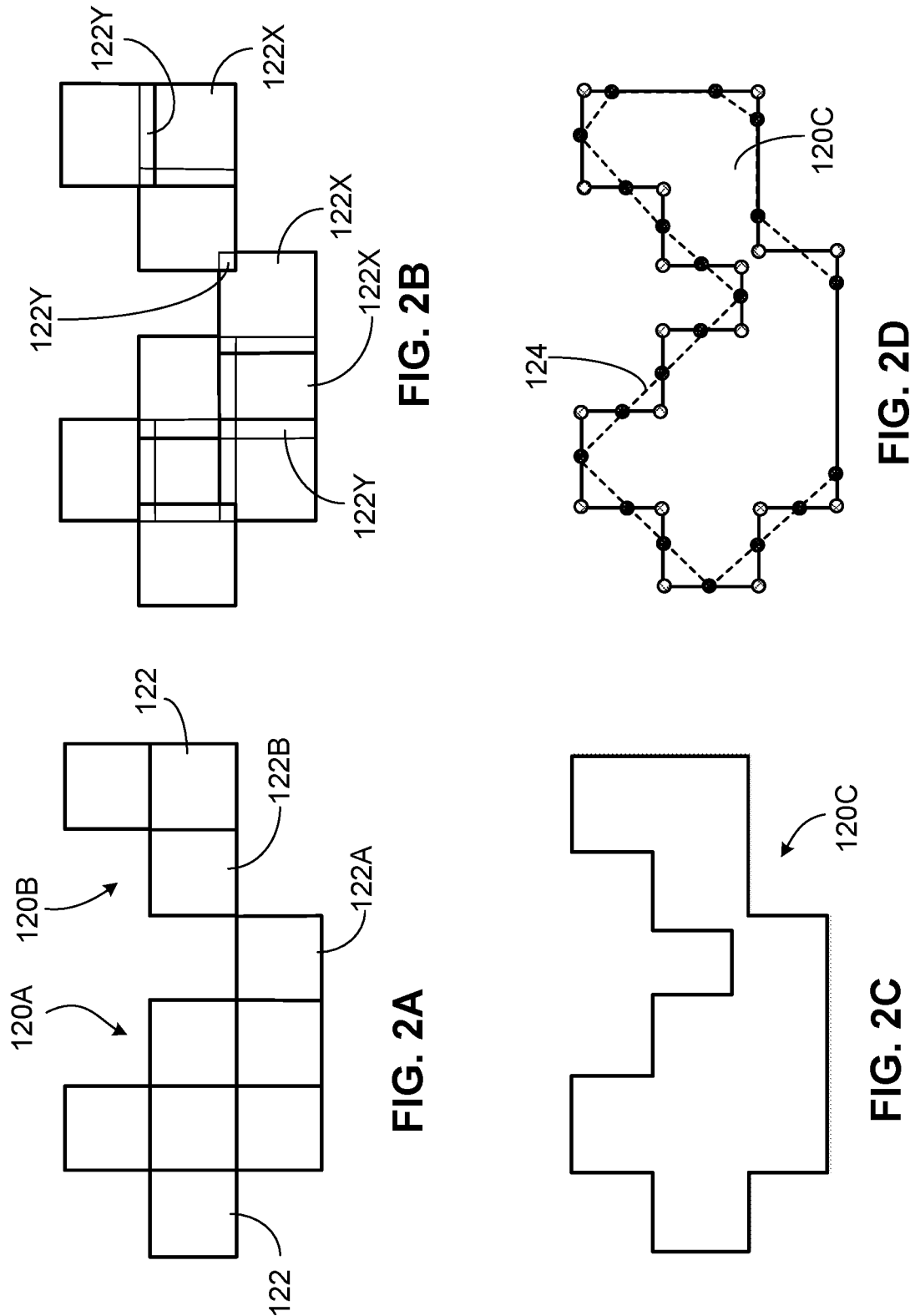
FIGS. 2A-2D illustrate another example of replacing a portion of an original pixel layout design with a modified pixel layout design.

FIGS. 2A though 2D illustrate another technique for approximating the contour of one or more clusters of pixels in a particular level of the original layout design. FIG. 2A shows an example of two clusters 120A, 120B of pixels 122 in the original optical design. Each cluster 120A, 120B includes a respective set of contiguous pixels, each of which has at least one edge in contact with an edge of another pixel in the same cluster. In the illustrated example, no edge of a pixel in the first cluster 120A contacts an edge of a pixel in the second cluster 120B. On the other hand, a corner of at least one pixel 122A in the first cluster 120A is in with contact a corner of a pixel 122B in the second cluster 120B. In such a situation, it may be desirable to merge the two clusters 120A, 120B into a single larger merged cluster, as discussed below.

In some implementations, to obtain the merged cluster, a sizing modification is performed in which a dimension (e.g., length of the edges) of each pixel 122 in both clusters 120A, 120B is increased slightly. For example, if the size of each pixel in the original design is 500 nm², the edges of each pixel can be increased, e.g., by 1 nm. As shown in FIG. 2B, the enlarged pixels 122X overlap one another somewhat (i.e., overlapping regions 122Y). The clusters containing the enlarged pixels 122X then can be merged into a single merged cluster 120C, as shown in FIG. 2C.

The contour of the merged cluster 120C of pixels then can be approximated by a polygon that has fewer corners and/or less zig-zag than the corresponding cluster(s) of pixels in the original design (FIG. 2A). This approximation can be accomplished, for example, by replacing a node at each corner of the merged cluster 120C with two nodes, each of which is displaced relative to the corner node and then removing duplicate nodes. FIG. 2D illustrates an example, in which the contour 124 of the replacement polygon (dashed line) is overlaid on the merged cluster 120C (solid line).

The corner node replacement can be implemented, for example, as follows. The position of each corner node of the merged cluster can be stored in memory. The information for the corner nodes can be stored sequentially, for example, in a clockwise or counterclockwise direction along the contour of the merged cluster. Each corner node is replaced by two new nodes in a manner that depends on whether the algorithm proceeds from one corner node to the next in the clockwise direction or counterclockwise direction. For example, if movement proceeds in the clockwise direction, then each corner node can be replaced as indicated in the following Table, in which each node may be referred to as a "point," and where "pixel/2" is half the length of a pixel edge.

TABLE 1

| Clockwise | Conditions | New replacement node #1 | New replacement node #2 |
|---|---|---|---|
| Situation 1 | X coordinate for point i + 1 > X coordinate for point i + 2 AND Y coordinate for point i > Y coordinate for point i + 1 | Point 1: i + 1 New X coordinate: X value for point i + 1 New Y coordinate: Y value for point i + 1 + pixel/2 | Point 2: i + 2 New X coordinate: X value for point i + 1 – pixel/2 New Y coordinate: Y value for point i + 1 |
| Situation 2 | Y coordinate for point i + 2 > Y coordinate for point i + 1 AND X coordinate for point i > X coordinate for point i + 1 | Point 1: i + 1 New X coordinate: X value for point i + 1 + pixel/2 New Y coordinate: Y value for point i + 1 + pixel/2 | Point 2: i + 2 New X coordinate: X value for point i + 1 New Y coordinate: Y value for point i + 1 |
| Situation 3 | X coordinate for point i + 1 > X coordinate for point i AND Y coordinate for point i + 1 > Y coordinate for point i + 2 | Point 1: i + 1 New X coordinate: X value for point i + 1 – pixel/2 New Y coordinate: Y value for point i + 1 | Point 2: i + 2 New X coordinate: X value for point i + 1 New Y coordinate: Y value for point i + 1 – pixel/2 |
| Situation 4 | Y coordinate for point i + 1 > Y coordinate for point i AND X coordinate for point i + 2 > X coordinate for point i + 1 | Point 1: i + 1 New X coordinate: X value for point i + 1 + pixel/2 New Y coordinate: Y value for point i + 1 – pixel/2 | Point 2: i + 2 New X coordinate: X value for point i + 1 New Y coordinate: Y value for point i + 1 |

On the other hand, if movement proceeds in the counterclockwise direction, then each corner node can be replaced as indicated in the following Table, in which each node may be referred to as a "point," and where "pixel/2" is half the length of a pixel edge.

TABLE 2

| Counter clockwise | Conditions | New replacement node #1 | New replacement node #2 |
|---|---|---|---|
| Situation 1 | X coordinate for point i + 1 > X coordinate for point i AND Y coordinate for point i + 2 > Y coordinate for point i + 1 | Point 1: i + 1 New X coordinate: X value for point i + 1 – pixel/2 New Y coordinate: Y value for point i + 1 | Point 2: i + 2 New X coordinate: X value for point i + 1 New Y coordinate: Y value for point i + 1 + pixel/2 |
| Situation 2 | Y coordinate for point i > Y coordinate for point i + 1 AND X coordinate for point i + 2 > X coordinate for point i + 1 | Point 1: i + 1 New X coordinate: X value for point i + 1 New Y coordinate: Y value for point i + 1 + pixel/2 | Point 2: i + 2 New X coordinate: X value for point i + 1 + pixel/2 New Y coordinate: Y value for point i + 1 |
| Situation 3 | X coordinate for point i + 1 > X coordinate for point i + 2 AND Y coordinate for point i + 1 > Y coordinate for point i | Point 1: i + 1 New X coordinate: X value for point i + 1 New Y coordinate: Y value for point i + 1 – pixel/2 | Point 2: i + 2 New X coordinate: X value for point i + 1 – pixel/2 New Y coordinate: Y value for point i + 1 |
| Situation 4 | X coordinate for point i > X coordinate for point i + 1 AND Y coordinate for point i +1 > Y coordinate for point i + 2 | Point 1: i + 1 New X coordinate: X value for point i + 1 + pixel/2 New Y coordinate: Y value for point i + 1 | Point 2: i + 2 New X coordinate: X value for point i + 1 New Y coordinate: Y value for point i + 1 – pixel/2 |

In some instances, a correction may be applied to the positions of the replacement nodes to compensate for the sizing operation that was described in connection with FIG. 2B.

Further, in some instances, the sizing and merging operations may be omitted. For example, if different clusters of pixels in the original design do not have respective corners in contact with one another (i.e., as shown in the example of FIG. 2A), the cluster sizing and merging operations need not be performed. In such cases, the contour approximation operations (e.g., FIG. 2D) can be performed with respect to a cluster of pixels in the original layout design rather than a merged cluster.

Figure 3A:
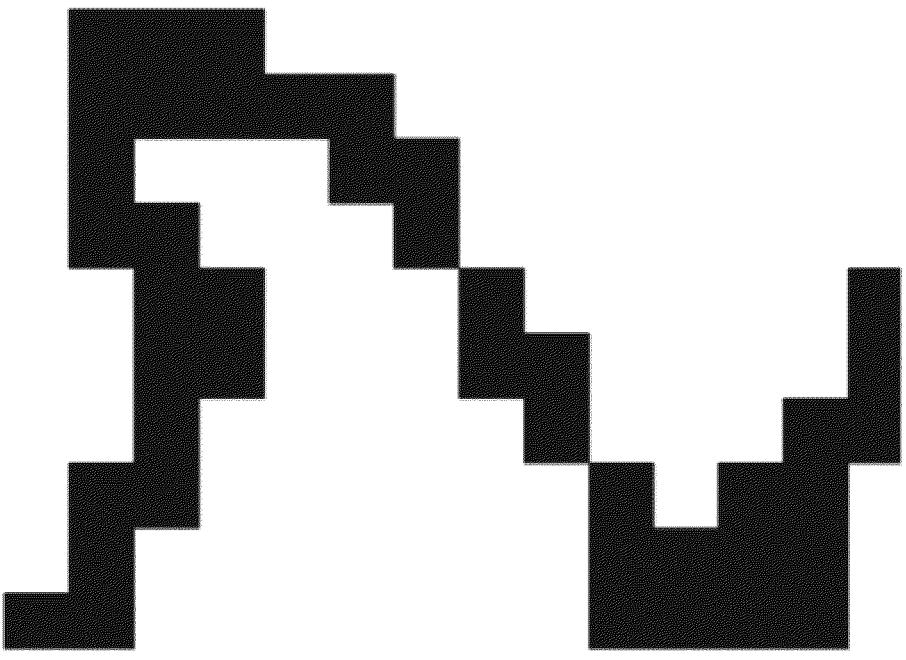
FIG. 3A is an example of a portion of an original pixel layout design.
Figure 3B:
FIG. 3B is a modified pixel layout design for the original pixel layout design of FIG. 3A.

FIG. 3A illustrates another example of a portion of an original pixel layout design. FIG. 3B illustrates a corresponding example in which the contours of the original pixel layout design of FIG. 3A are replaced by new contours that approximate, respectively, the contours of the original layout design in accordance with the techniques described above. The replacement contours in FIG. 3B may have fewer corners and/or less zig-zag than the contours of the corresponding clusters of pixels in the original layout design of FIG. 3A. In general, as noted above, the straight portions of the contour can have a length that is greater than then the pixel size (i.e., greater than the center-to-center distance between two adjacent pixels having a common corner).

The contours of the original pixel clusters at each level of the original layout design may be replaced by new contours that approximate, respectively, the contours of the original layout design in accordance with the techniques described above to obtain a modified pixel design layout. The modified pixel layout design then can be used to fabricate a master tool (e.g., having a multi-level structured surface corresponding to the modified pixel layout design) for the DOEs. In general, the contour delineates, at least in part, the area of the optical element having an optical function.

FIGS. 4A-4I illustrate an example of a process of fabricating a master tool based on a modified pixel layout design.

As shown, for example, in FIG. 4A, a substrate, such as a wafer 200, is provided. The wafer 200 can be composed, for example, of a layer of polysilicon, pure single-crystalline silicon or amorphous silicon on glass or sapphire. Other materials for the wafer 200 may be appropriate in some implementations. An additive lithography process, for example, can be used to form the different levels for the design of the master tool. An additive lithographic technique allows for careful control of the resist exposure and reflow processes for fabricating the master tool for complex, multi-level optical elements. The optical design can be transformed into a multilevel diffractive structure which then can be split into multiple masking patterns. An example is described below.

For example, as part of the process of fabricating the master tool, a first layer of resist 202 is deposited (e.g., by spin coating) onto the upper surface of the wafer 200 and, using a first mask, the resist layer 202 is exposed selectively by lithographic techniques, e.g., electron beam lithography (EBL). The exposed portions of the resist layer 202 then are developed and removed such that selected regions of the wafer surface are no longer covered by the resist (see FIG. 4B). Next, as indicated in FIG. 2B, the wafer 200 is etched, from the wafer surface, in the regions not covered by the resist 202 to form openings 216 down to a first depth d1. The remaining portions of the resist 202 then can be removed. The resulting first level pattern 216 is shown in FIG. 4C.

Next, as shown in FIG. 4D, in preparation for a second etch into the wafer, a second resist layer 218 is deposited over the wafer 200 (e.g., by spin coating). The resist 218 is present in the previously-formed openings 216. The second resist layer 218 then is exposed selectively by lithographic techniques (e.g., EBL) and developed so that particular regions of the wafer are no longer covered by the second resist layer 218 (see FIG. 4E). A second lithographic mask can be used during the foregoing exposure. In the illustrated example, following exposure and development of the second resist layer 218, the resist only partially fills the previously-formed openings 216 and only partially covers the upper surface of the substrate 200. Next, the wafer 200 is etched in the regions not covered by the resist 218 (see FIG. 4E). The remaining resist layer 218 then can be removed. The resulting second level pattern 219 is shown in FIG. 4F.

Figure 4G:
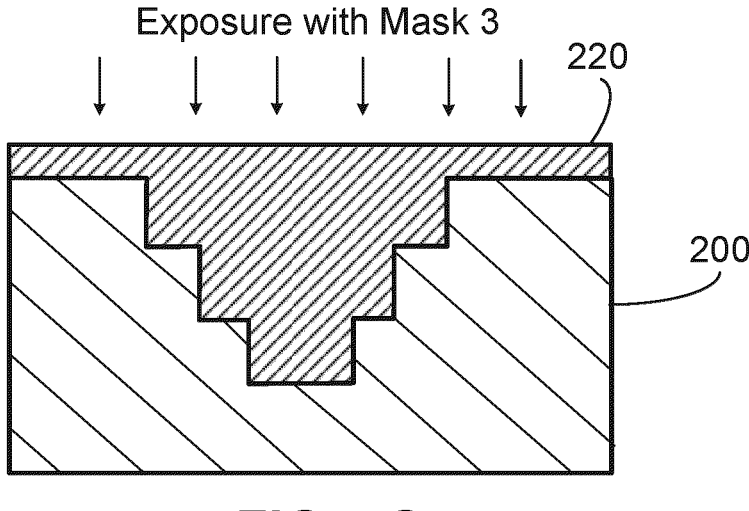
Figure 4H:
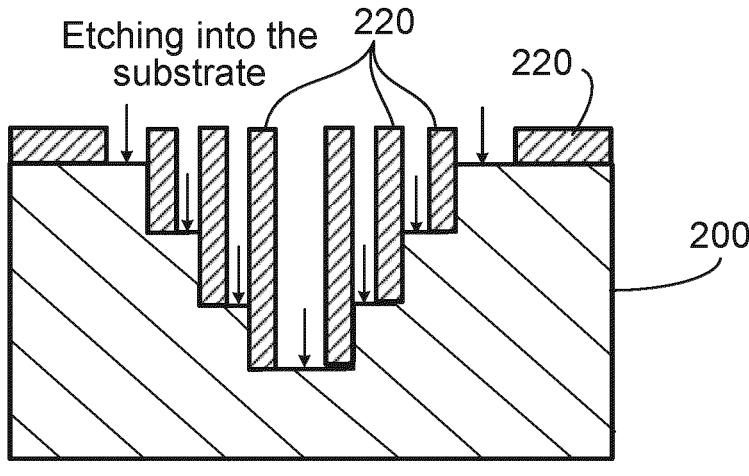
Figure 4I:
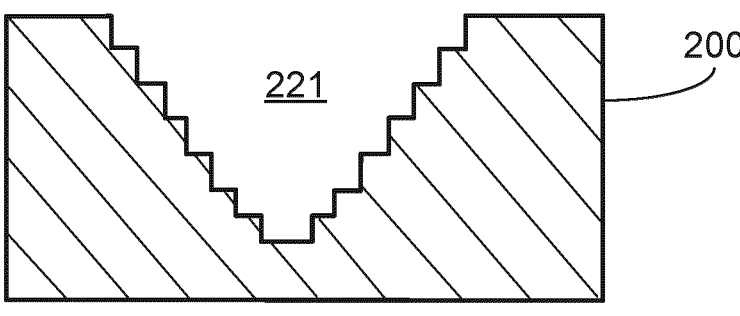

Next, as shown in FIG. 4G, in preparation for a third etch into the wafer, a third resist layer 220 is deposited over the wafer 200 (e.g., by spin coating). The resist 220 is present in the previously-formed openings 216. The second resist layer 218 then is exposed selectively by lithographic techniques (e.g., EBL) and developed so that particular regions of the wafer are no longer covered by the third resist layer 220 (see FIG. 4H). A third lithographic mask can be used during the foregoing exposure. In the illustrated example, following exposure and development of the third resist layer 220, the resist only selectively fills the openings previously etched into the wafer during the first and second etch steps and only partially covers the upper surface of the substrate 200. Next, the wafer 200 is etched in the regions not covered by the resist 220 (see FIG. 4H). The remaining resist layer 220 then can be removed. The resulting third level pattern 221 is shown in FIG. 4I.

The combination of the various lithographic and etch processes results in regions at multiple different depths (see FIG. 4I), which correspond to the different levels needed for the master tool. Details of the various masks used for the lithography and etch steps can be specified based on the modified pixel layout design. In this manner, a multi-level master tool can be fabricated. Although FIGS. 4A-4I illustrate an example of a process of fabricating an eight-level master tool based on a modified pixel layout design, similar processes can be used to fabricate master tools having fewer of more than eight levels based on a modified pixel layout design. Some or all of the operations illustrated in FIGS. 4A-4I may be part of an automated process. In some implementations, other techniques can be used to fabricate the master tool.

Using a modified pixel layout design as described in connection with the foregoing examples can result in one or more advantages in some cases. For example, as the number of nodes associated with each cluster of pixels decreases, the amount of memory needed to store the information becomes smaller, which can make production easier (e.g., less computing required for EBL proximity correction; increased e-beam writing speed).

Figure 5A:
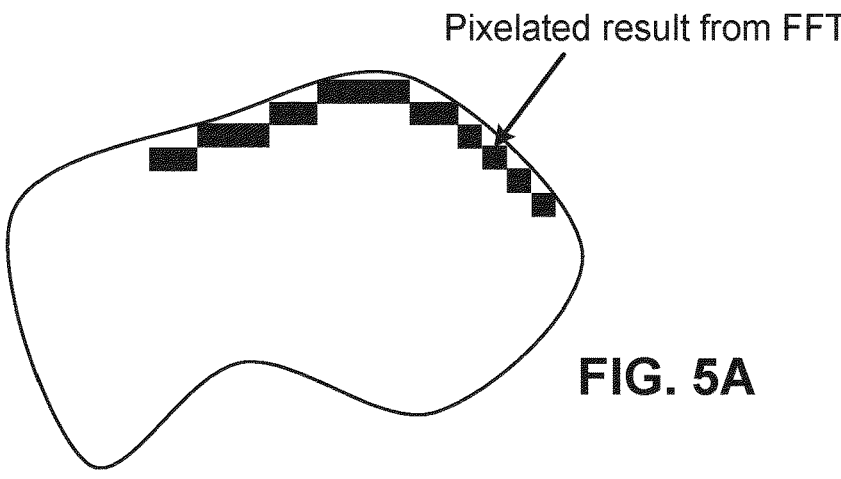
FIGS. 5A-5C are an example of how line edge roughness in a pixel layout design can be reduced in some implementations.
Figure 5B:
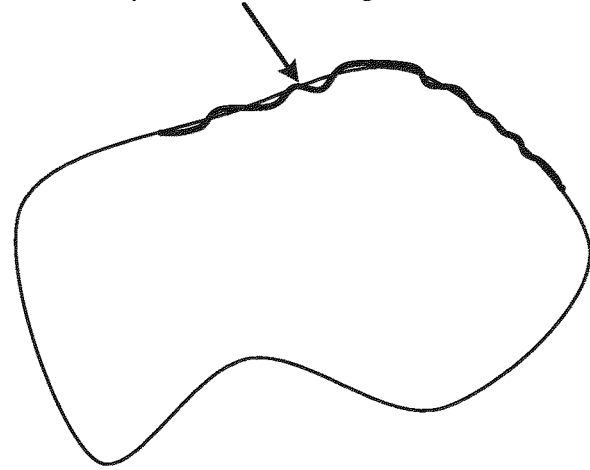
Figure 5C:
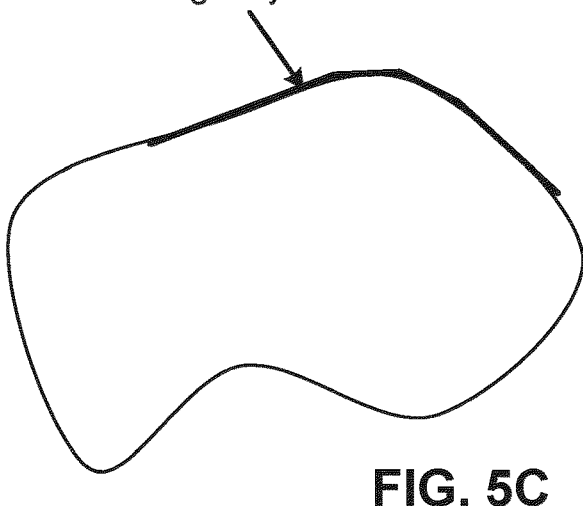

Further, in some cases, optical performance of DOEs that are manufactured from a master tool obtained using a pixel layout design can be improved. If the pixel size is small, it is, in general, possible to make a higher performing design compared to a situation in which the pixel size is larger. However, such small pixel sizes can result in line edge roughness in the resulting DOEs (see FIG. 5B). The line edge roughness in the DOE structures tends to increase optical scattering, which can decrease optical performance. On the other hand, in some implementations, DOEs manufactured based on a master tool obtained using a modified pixel layout design as described above can have less line edge roughness (see FIG. 5C), and thus better optical performance.

Figures 6A, 6B:
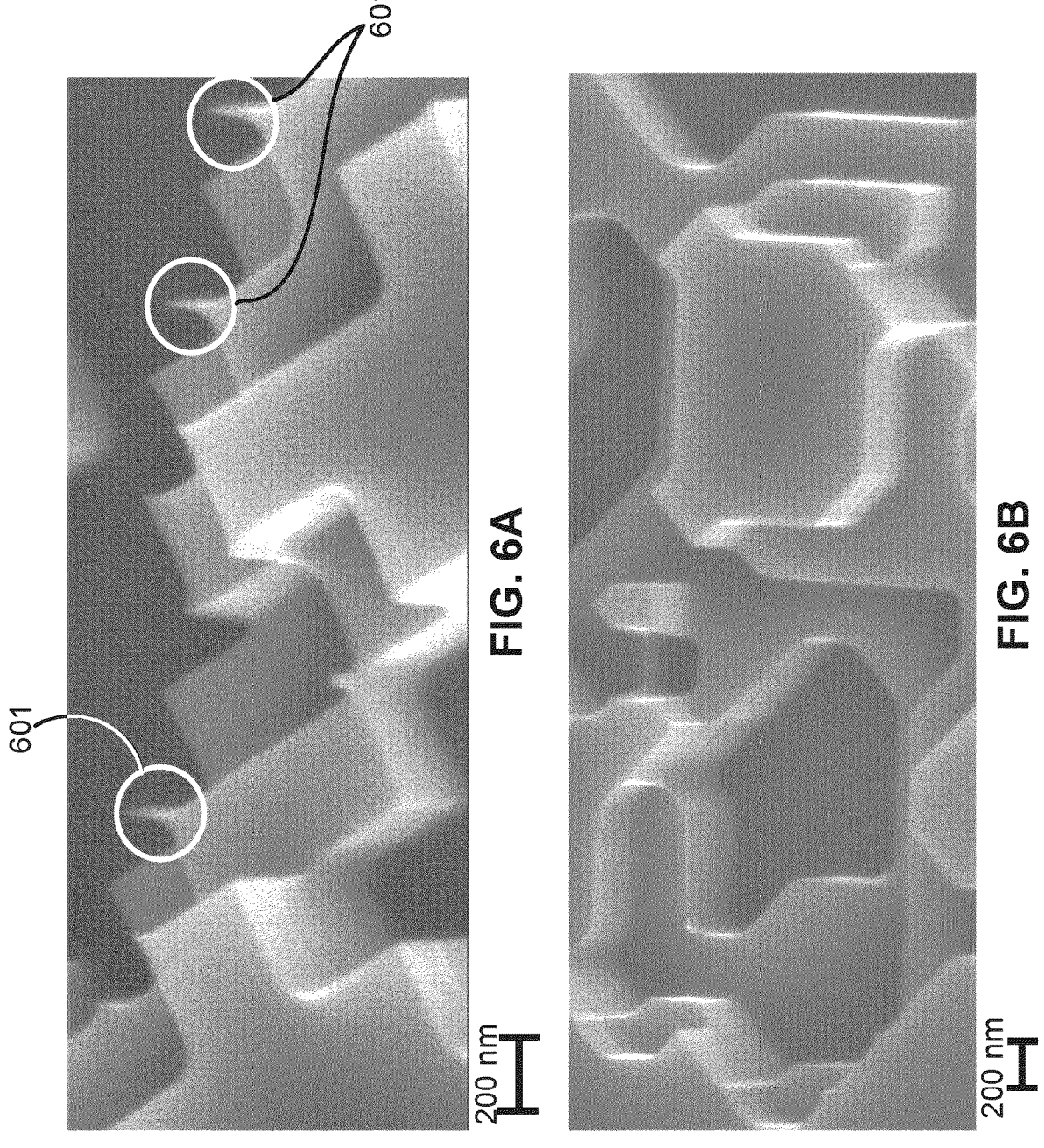
FIGS. 6A and 6B are images of portions of a master tool.

A further advantage that can be obtained in some cases is the avoidance of the formation of pointy tips 601 at the pixel corners in the master tool that sometimes occur in prior techniques (see FIG. 6A). Such pointy tips 601 need to be removed; otherwise they will be present in the replication tools and/or DOEs made from the master tool. Using the modified pixel layout design—according to which the overall contour of a particular cluster of original regular polygonal pixels can be approximated by a single polygon that reduces the total number of edges and shortens the total length of the edges relative to the contour of the cluster of pixels in the original layout design—can help avoid occurrence of such pointy tips (see FIG. 6B).

After the master tool is fabricated based on the modified pixel layout design, the master tool can be used to manufacture one or more (negative) sub-masters or replicas, which in turn can be used directly or indirectly to replicate DOEs, for example, as part of a mass production manufacturing process. Manufacturing the DOEs may take place in some instances at a wafer-level in which tens, hundreds, or even thousands of DOEs are replicated in parallel using the same sub-master or other tool derived from the master.

In some instances, a structured element of the master (or a sub-master) is replicated into liquid or plastically deformable material, then hardened to make it dimensionally stable, and the structured element (e.g., the DOE) is removed. These replicating, hardening and removing steps are repeated over different parts of a substrate to form replicas of the same structured element.

In general, each diffractive optical element can include a multi-level structured surface, at least a portion of which has a contour having straight lines, each of which has a length larger than a pixel size in the optical element, wherein the pixel size is a center-to-center distance between two adjacent pixels having a common center. In some instances, the straight lines change direction at least once at an angle θ other than 90° or 180°. For example, in some instances, the straight lines change direction at least once at an angle θ, where 2°<θ<88° or 92°<θ<178°. Further, in some instances, the straight lines change direction at least once at an angle θ, where 5°<θ<85° or 95°<θ<175°.

Examples of diffractive optical elements that can be manufactured using the master tool include diffraction and other gratings, beam splitters, beam shapers, collimators, diffractive diffusers, as well as other optical elements.

Various aspects of the subject matter and the functional operations described in this specification can be implemented in digital electronic circuitry, or in computer software, firmware, or hardware, including the structures disclosed in this specification and their structural equivalents, or in combinations of one or more of them. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Computer readable media suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Various modifications may be made within the spirit of this disclosure. Accordingly, other implementations are within the scope of the claims.

What is claimed is:

1. A method comprising:
    modifying a first pixel layout design for diffractive optical elements to obtain a modified pixel layout design, wherein the first pixel layout design comprises pixels, each of which has a rectangular shape, and wherein modifying the first pixel layout design includes approximating a contour of a cluster of pixels in the first pixel layout design by a single polygon that reduces a total number of edges relative to the contour of the cluster of pixels in the first pixel layout design; and
    using the modified pixel layout design to form a master tool for production of the diffractive optical elements.

2. The method of claim 1 including performing the modifying with respect to one or more clusters of pixels in each of different levels of the first pixel layout design.

3. The method of claim 1 wherein modifying the first pixel layout design includes approximating the contour of the cluster of pixels in the first pixel layout design by a single polygon that shortens an overall length of the edges relative to the contour of the cluster of pixels in the first pixel layout design.

4. The method of claim 1 wherein approximating the contour of the cluster of pixels includes replacing a zig-zag portion of a contour of the cluster of pixels with a straight line.

5. The method of claim 4 including determining the straight line by minimizing a difference between (i) a first area of the pixels in the cluster, wherein the first area is beyond a boundary of the approximated contour defined in part by the straight line and (ii) a second area that is not part of the pixels in the cluster and that is within the boundary.

6. The method of claim 1 wherein approximating the contour of the cluster of pixels includes replacing each corner node in the cluster with a respective pair of nodes.

7. The method of claim 6 wherein approximating the contour of the cluster of pixels includes replacing each corner node in the cluster with a respective pair of nodes, each of which is displaced relative to the corner node.

8. The method of claim 1 including:

merging a plurality of clusters of pixels, whose contour coincides in at least one point, in the first pixel layout design to obtain a merged cluster of pixels, and approximating a contour of the merged cluster of pixels by replacing each corner node in the contour of the merged cluster with a respective pair of nodes.

* * * * *